(12) United States Patent
Harper (10) Patent No.: US 10,941,910 B1
(45) Date of Patent: *Mar. 9, 2021

(54) LANDSCAPE LIGHTING JUNCTION DEVICE

(71) Applicant: Volt, LLC, Tampa, FL (US)

(72) Inventor: Jesse Daniel Harper, Wesley Chapel, FL (US)

(73) Assignee: Volt, LLC, Tampa, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,643

(22) Filed: Jul. 21, 2019

Related U.S. Application Data

(63) Continuation of application No. 15/796,057, filed on Oct. 27, 2017, now Pat. No. 10,364,952.

(60) Provisional application No. 62/413,554, filed on Oct. 27, 2016.

(51) Int. Cl.
| | |
|---|---|
| *H05K 5/06* | (2006.01) |
| *H05K 5/02* | (2006.01) |
| *F21S 8/08* | (2006.01) |
| *F21V 23/00* | (2015.01) |
| *F21V 23/06* | (2006.01) |
| *F21V 15/01* | (2006.01) |
| *F21W 131/10* | (2006.01) |

(52) U.S. Cl.
CPC ............ *F21S 8/081* (2013.01); *F21V 15/01* (2013.01); *F21V 23/001* (2013.01); *F21V 23/06* (2013.01); *H05K 5/0247* (2013.01); *H05K 5/064* (2013.01); *F21V 23/003* (2013.01); *F21W 2131/10* (2013.01)

(58) Field of Classification Search
CPC ..... F21V 23/001; F21V 15/01; H05K 5/0226; H05K 5/0247; H05K 5/064; H05K 5/066; H05K 5/065; F21S 8/081
See application file for complete search history.

(56) References Cited

U.S. PATENT DOCUMENTS

| | | | | |
|---|---|---|---|---|
| 4,759,726 A | * | 7/1988 | Naylor | H01R 4/5008 439/441 |
| 5,414,607 A | | 5/1995 | Harris et al. | |
| 5,675,194 A | * | 10/1997 | Domigan | H01R 25/168 174/50 |

(Continued)

FOREIGN PATENT DOCUMENTS

CN 201944618 U 8/2011

OTHER PUBLICATIONS

"WAGO 222—The flexible all-rounder" video, uploaded Sep. 9, 2013 at https://www.youtube.com/watch?v=-PfN_wwkujQ.

(Continued)

*Primary Examiner* — Timothy J Thompson
*Assistant Examiner* — Amol H Patel
(74) *Attorney, Agent, or Firm* — Nelson Mullins Riley & Scarborough, LLP (57) ABSTRACT

A landscape lighting junction device includes a junction body having a first portion and a second portion connectable together in a closed position defining an interior cavity. The junction device may further include a terminal block disposed in the junction body to facilitate the electrical connection of a power source to at least one lighting fixture. The junction device may further include a predetermined amount of viscous sealant disposed in the junction body.

7 Claims, 7 Drawing Sheets

(56) References Cited

U.S. PATENT DOCUMENTS

| | | |
|---|---|---|
| 6,337,792 B1 | 1/2002 | George |
| 7,044,776 B2 | 5/2006 | King, Jr. et al. |
| 7,677,932 B2 | 3/2010 | King, Jr. et al. |
| 7,699,481 B2 | 4/2010 | Mullen |
| 7,988,503 B2 | 8/2011 | King, Jr. et al. |
| 8,006,375 B2 | 8/2011 | Mullen |
| 10,364,972 B1 | 7/2019 | Breedlove, Sr. et al. |
| 2005/0118851 A1* | 6/2005 | King, Jr. ............ H01R 4/36 |
| | | 439/276 |

OTHER PUBLICATIONS

Co-pending U.S. Appl. No. 16/517,642, filed Jul. 21, 2019, all enclosed pages cited.

* cited by examiner

LANDSCAPE LIGHTING JUNCTION DEVICE

PRIORITY CLAIM

This application is a continuation of U.S. utility patent application Ser. No. 15/796,057 filed Oct. 27, 2017, now pending, which is based upon and claims the benefit of U.S. provisional application Ser. No. 62/413,554, filed Oct. 27, 2016. Both of the aforementioned applications are incorporated fully herein by reference in their entireties for all purposes.

FIELD OF THE INVENTION

The present invention relates generally to the art of landscape lighting systems, and more particularly, to a junction device for a landscape lighting system that enables the electrical connection of devices of the landscape lighting system.

BACKGROUND

Outdoor landscape lighting systems are commonly used in both commercial and residential settings for the illumination of structures, walkways, trees, shrubbery, etc. In an outdoor landscape lighting system, users may find it difficult and time consuming to install multiple lighting fixtures. For example, the user may have to spend considerable time and use various tools to connect each lighting fixture in parallel with a power source of the landscape lighting system.

SUMMARY

Example embodiments of the present invention recognize and address considerations of prior art constructions and methods.

In one example embodiment, a landscape lighting junction device is provided. The junction device may include a junction body having a first portion and a second portion connectable together in a closed position defining an interior cavity. The junction device may further include a terminal block disposed in the junction body to facilitate the electrical connection of a power source to at least one lighting fixture. The junction device may further include a predetermined amount of viscous sealant disposed in the junction body.

In another example embodiment, an outdoor landscape lighting system is provided. The system may include at least one lighting fixture, a power source, and a pair of junction devices. Each junction device may include a junction body having a first portion and a second portion connectable together in a closed position defining an interior cavity. The junction device may further include a terminal block disposed in the junction body to facilitate the electrical connection of a power source to at least one lighting fixture. The junction device may further include a predetermined amount of viscous sealant disposed in the junction body.

Those skilled in the art will appreciate the scope of the present invention and realize additional aspects thereof after reading the following detailed description of example embodiments in association with the accompanying drawing figures.

BRIEF DESCRIPTION OF THE DRAWINGS

A full and enabling disclosure of the present invention, including the best mode thereof directed to one of ordinary skill in the art, is set forth in the specification, which makes reference to the appended drawings, in which.

DETAILED DESCRIPTION OF THE PREFERRED EMBODIMENTS

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations. Like reference numerals refer to like elements throughout. Furthermore, as used herein, the term "or" is to be interpreted as a logical operator that results in true whenever one or more of its operands are true. As used herein, operable coupling should be understood to relate to direct or indirect connection that, in either case, enables functional interconnection of components that are operably coupled to each other.

Users may prefer a landscape lighting system that is easy and quick to setup and install. Some example embodiments described herein provide a landscape lighting system having a junction device that facilitates electrical connection of a power source to the various lighting fixtures. The junction device may preferably have a relatively small size, as described below, and be configured to be buried underground while maintaining the integrity of the electrical connections made at the junction device.

Figure 1:
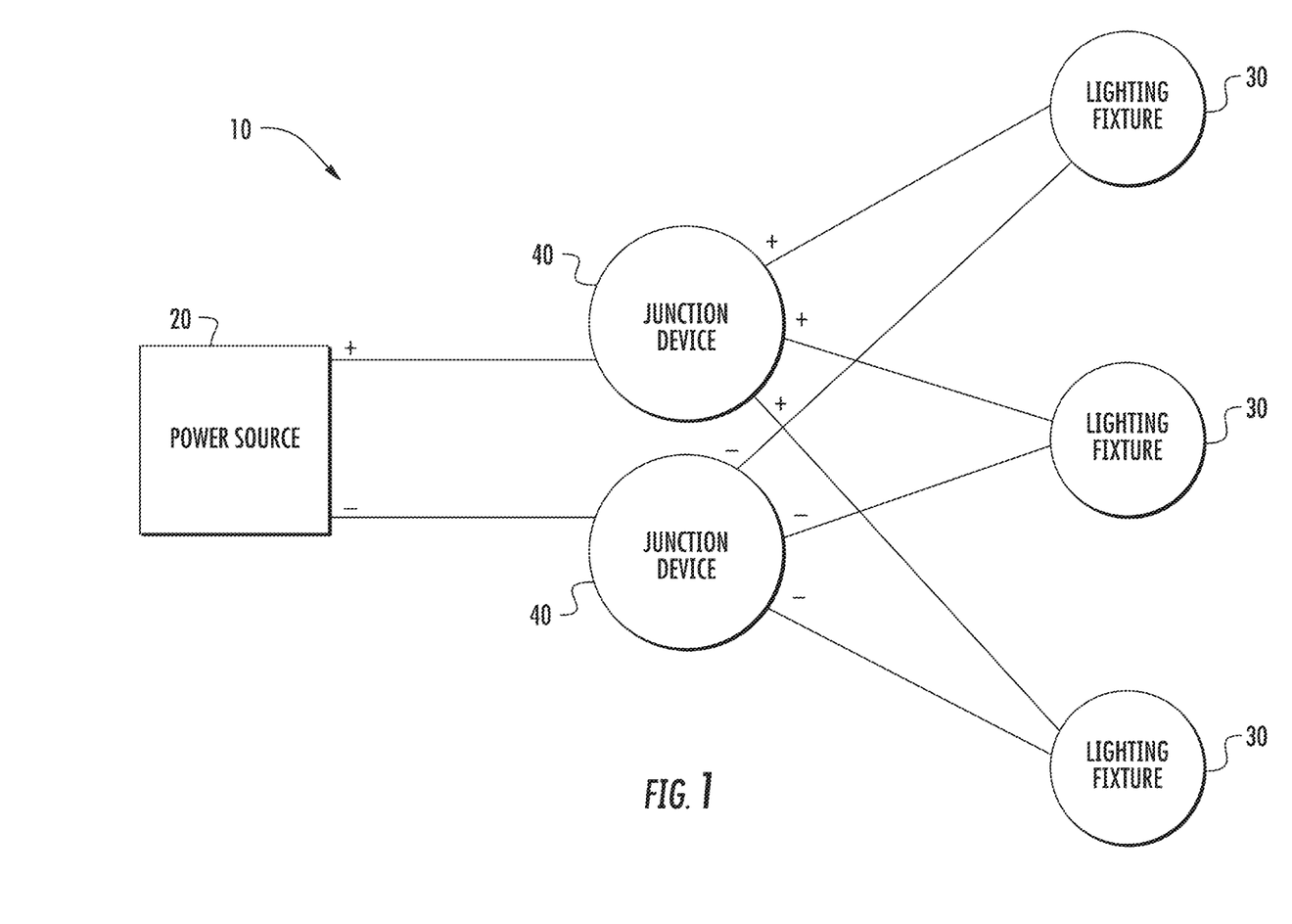
FIG. 1 is a diagrammatic representation of an outdoor lighting system in accordance with an example embodiment.

FIG. 1 illustrates an exemplary outdoor landscape lighting system according to an embodiment of the present invention. As shown, the outdoor landscape lighting system 10 may include a power source 20, at least one lighting fixture 30, and one or more junction devices (or simply "junctions") 40. In this embodiment, for example, a pair of junctions 40 are provided for respective "positive" and "negative" ("ground") polarity wiring. (As will be apparent from the description below, however, embodiments are contemplated in which a single junction connects wiring of both polarities from the power source to downstream loads.) The lighting fixtures 30 may thus be placed where desired throughout an outdoor landscape and connected in parallel at the junctions 40. Wiring may then extend back to the power source 20 from the junctions 40, thereby simplifying and reducing time for the installation process.

The power source 20 of the landscape lighting system 10 may comprise a transformer. The transformer may plug into a standard AC outlet, such as a 120 VAC outlet typically used in North America. Moreover, the transformer may have one or more AC outputs between 8V-15V. The transformer may also have control circuitry and be used as part of a control panel for collectively controlling the lighting fixtures 30. For example, the control panel can include a timer that turns all of the lights on or off at specified intervals, or a control for brightening or dimming the lighting fixtures 30 in the landscape lighting system 10. One skilled in the art will appreciate, however, that other means for powering the lighting fixture 30 are within the scope of the invention. For example, the power source 20 may be solar or battery powered or the like.

While FIG. 1 illustrates three lighting fixtures 30 in the landscape lighting system 10, embodiments are contemplated that have more or less than three lighting fixtures 30. Each lighting fixture 30 may include a lighting source such as an incandescent, halogen, LED, and/or the like lighting source. Moreover, each lighting fixture 30 may also include a control board. The control board may, for example, contain power supply circuitry that converts the AC voltage received from the power source 20 to a DC voltage suitable for the lighting fixture 30.

As noted above, a pair of junctions 40 are provided in this embodiment. Each junction 40 includes a terminal block 130 (see FIGS. 2 and 3) that serves to connect a respective polarity of the power source 20 to the lighting fixtures 30. For example, one junction 40 may be configured to receive a positive lead wire of the power source 20 and each lighting fixture 30, and the other junction 40 may be configured to receive the negative lead wire of the power source 20 and each lighting fixture 30.

Figure 2:
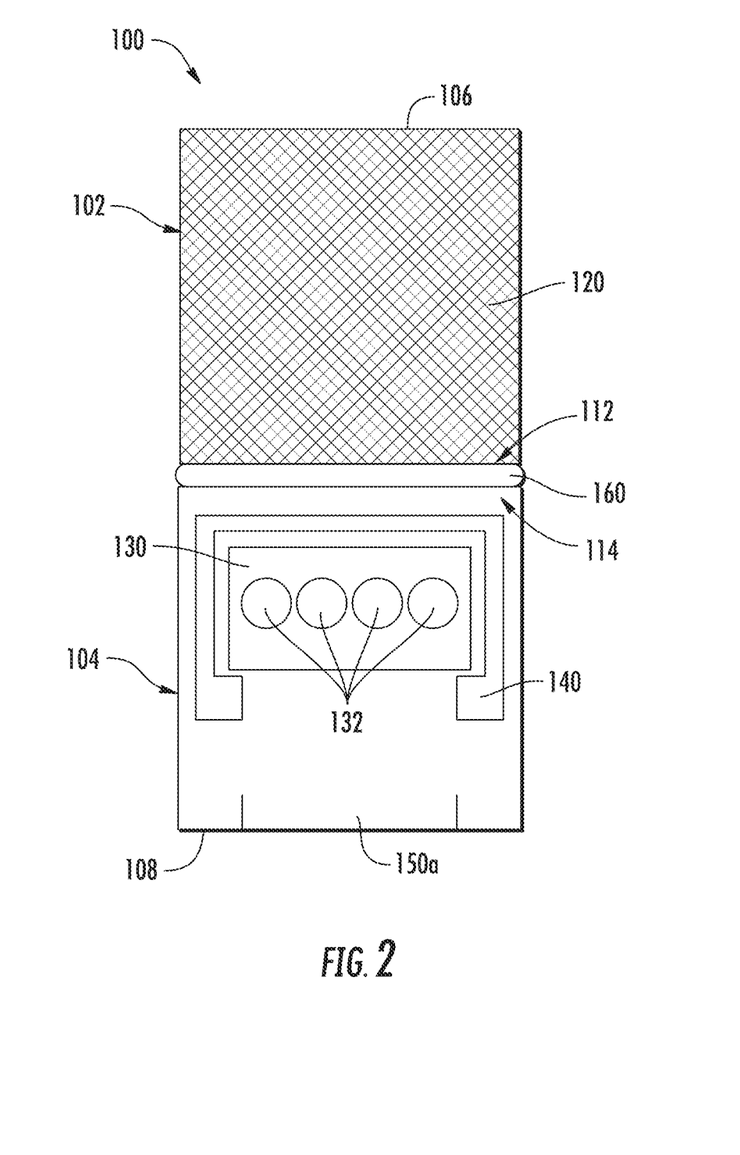
FIG. 2 is a diagrammatic plan view of a junction device in accordance with an example embodiment.
Figure 3:
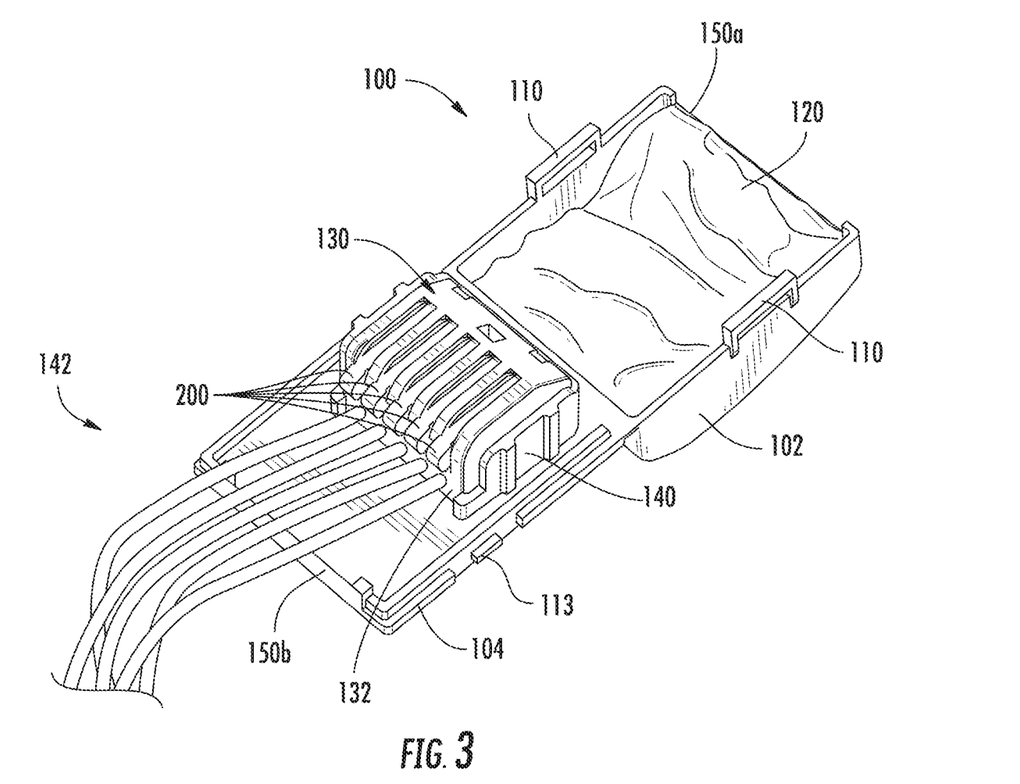
FIG. 3 is a perspective view of a junction device in accordance with an example embodiment in an open position.

FIGS. 2-5 illustrate examples of a junction 40 in accordance with the present invention. Referring particularly to FIGS. 2 and 3, the junction 40 may include a junction body 100 (i.e., a housing structure) that when closed defines a cavity for containing various internal components. For example, a terminal block 130 and a sealant 120 may be located inside the junction body 100. The junction body 100 may be constructed of plastic, metal (e.g., steel), or any other rigid or semi-rigid material sufficient to house and support the internal components.

In this case, junction body 100 includes a first (top) portion 102 and a second (bottom) portion 104 that may be coupled together into a closed position. Preferably, junction body 100 will have a relatively small size sufficient to accommodate terminal block 130. In accordance with some example embodiments, for example, the top portion 102 and the bottom portion 104 may each have a length and width of less than two inches. As a result, the junction when closed forms a small capsule that is easily buried.

Moreover, a second end 112 of the top portion 102 may be connected to a second end 114 of the bottom portion 104 via a hinge 160. It should be understood that the top portion 102, bottom portion 104, and the hinge 160 may be one molded piece in which case the hinge may be integrally formed as a "living hinge." In other cases, however, the top portion 102, the bottom portion 104, and the hinge 160 may each be separate pieces that are attached together. Accordingly, the top portion 102 may be configured to rotate from a fully open first position to a fully closed second position around the hinge 160 to lock into engagement with the bottom portion 104.

FIGS. 2 and 3 show the top portion 102 in the first position. In the first position, the first end 106 of the top portion 102 and the first end 108 of the bottom portion 104 may be displaced from one another. For example, the top portion 102 and the bottom portion 104 may form a 180° angle with respect to each other. In other cases, however, the top portion 102 and the bottom portion 104 may form anywhere from about a 90° to a 180° angle with each other when fully open.

Figure 4:
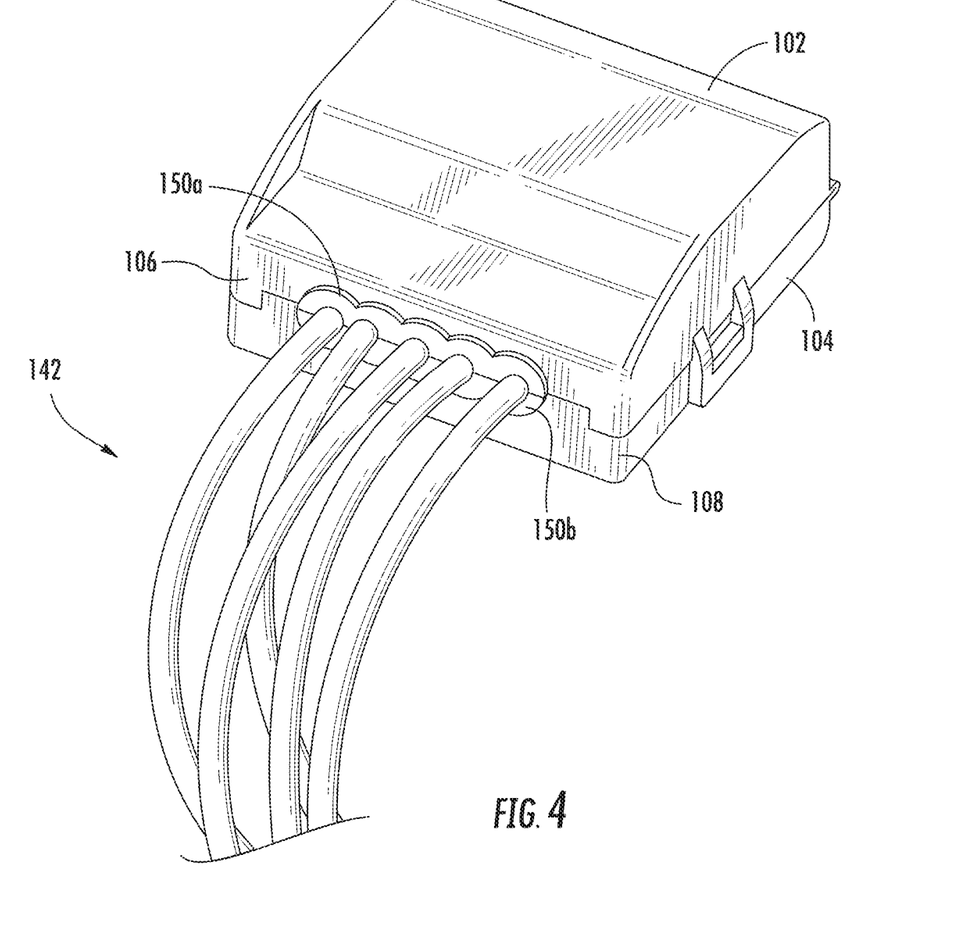
FIG. 4 illustrates the junction device of FIG. 3 in a closed position.

FIG. 4 shows top portion 102 in the second position in which the top portion 102 and bottom portion 104 have been rotated with respect to each other via hinge 160 such that the first end 106 of top portion 102 and the first end 108 of the bottom portion 104 are substantially flush with one another. In this regard, the junction body 100 may also include a locking mechanism, such as a locking tab or a snap locking mechanism, in order to retain the top portion 102 and the bottom portion 104 together in the second position. As shown in FIG. 3, for example, the locking mechanism may comprise a pair of U-shaped hooks 110 located on the sides of top portion 102. When junction body 100 is closed, the hooks 110 each flex outward to clear a corresponding protrusion (see protrusion 113) on bottom portion 104. Once the protrusion is cleared, hooks 110 return to their non-flexed position so as to retain top portion 102 and bottom portion 104 together.

In accordance with other example embodiments, rather than the top portion 102 and the bottom portion 104 being operably coupled at respective second ends 112 and 114 (e.g., by a hinge), the top portion 102 may be configured to snap fit or slide over the bottom portion 104 thereby coupling the top portion 102 and the bottom portion 104. It should be understood that the top portion 102 and the bottom portion 104 may be operably coupled via any way known to a person skilled in the art.

As shown in FIGS. 2 and 3, a support wall 140 may be disposed within the bottom portion 104 of the junction body 100 to receive terminal block 130. In preferred embodiments, the support wall 140 may be integrally formed with bottom portion 104 so as to extend upward from an interior surface of the bottom portion 104. For example, support wall 140 may be generally U-shaped as shown to define a receptacle for terminal block 130. As illustrated in FIG. 3, the U-shaped configuration of support wall 140 advantageously leaves one side open to facilitate routing of wires 142 to be connected together at terminal block 130. Preferably, the support wall 140 will have a height no greater than that of terminal block 130 so that it does not interfere with closing of junction body 100. Terminal block 130 may be retained in the receptacle by press fit, a resilient locking mechanism, adhesive, or any other suitable technique.

As noted above, the terminal block 130 enables the electrical connection of several devices located in a landscape lighting system 10 such as the lighting fixtures 30 and the power source 20. Accordingly, the terminal block 130, as illustrated in FIGS. 2 and 3, may be configured to receive and connect together either of the positive lead wire or the negative lead wire of each of the power source 20 and the lighting fixtures 30. Moreover, the terminal block 130 may provide a place for troubleshooting problems associated with the landscape lighting system 10 and for testing the voltage of each lighting fixture 30. Even further, because the terminal block 130 serves as a node for connection of the lighting fixtures 30 to the power source 20, voltage received from the power source 20 may be equalized among each of the lighting fixtures 30 connected to the terminal block 130.

In the illustrated embodiment, the terminal block 130 includes a plurality of ports (inlets) 132 for respective wire ends. Ports 132 are shown on top of terminal block 130 in FIG. 2, whereas ports 132 are shown facing toward first end 108 of bottom portion 104 in FIG. 3. In any event, a releasable clamping mechanism (a "clamp") is preferably associated with each of the ports 132 to retain a stripped wire end in position once it is inserted. For example, the clamping mechanism may be locked and unlocked via a respective lever 200 that is pivoted away from the associated port 132 for unlocking and toward the associated port 132 for locking. A conductive bus inside the terminal block 130 electrically connects all of the wires together that are inserted into the respective ports 132. As a result, wire nuts or other such devices are not required in order to make and maintain the desired connections.

As shown in FIG. 3, the terminal block 130 may include five ports 132. (Four such ports are shown in FIG. 2.) Accordingly, the junction 40 may enable the connection of up to five devices (e.g., one power source 20 and up to four lighting fixtures 30). In other cases, however, the terminal block 130 may include more or less than five ports 132 to enable the connection of more or less than five devices. An acceptable terminal block for this purpose is available from WAGO Corporation of Germantown, Wis. under the name Lever-Nuts® (222 Series).

In accordance with some example embodiments, first end 106 of the top portion 102 and the first end 108 of the bottom portion 104 may include a respective channel portion 150a and 150b. When junction body 100 is in the closed position, channel portions 150a and 150b are aligned in opposition to one another. Together, they act as a guide for passage of the wires 142 into the junction body 100. Specifically, wires 142 connected at terminal block 130 pass through the opposed channel portions 150a-b so they do not interfere with closing of the junction body 100. A suitable seal structure may also be provided at channel portions 150a-b to minimize escape of sealant 120. In the illustrated embodiment (FIG. 3), for example, a thin membrane wall produced during the forming process may extend across channel portions 150a-b. The membrane walls flex to accommodate wires 142 when junction body 100 is closed. Sealant 120 may not only enclose or seal off the components disposed within the junction 40 but the sealant 120 may serve to further seal off the location where the wires 142 extend from body 100.

As further shown in FIGS. 2 and 3, the top portion 102 of the junction body 100 is preferably configured as a compartment (or "well") to accommodate terminal block 130 when junction body 100 is in the second (closed) position. In addition, top portion 102 may be filled with a predetermined amount of viscous sealant 120 when the top portion 102 is in the first (open) position. As the top portion 102 is closed with respect to the bottom portion 104, some of the sealant 120 will be displaced (i.e., as it encounters terminal block 130). As a result, the internal components (e.g., the terminal block 130 and any connections made at the terminal block 130) disposed within the junction body 100 will be surrounded and protected by the sealant 120. Therefore, once the wires are connected to the terminal block 130, the top portion 102 and bottom portion 104 may be rotated from the first position to the second position to force the sealant 120 around the wire connections at the terminal block 130. Accordingly, the sealant 120 may act as barrier to protect the connections made at terminal block 130 from external environmental factors such as moisture. Thus, if a user buries the junction 40 underground, the sealant 120 may serve to waterproof the junction 40 and to limit corrosion of the wires that are connected at the terminal block 130.

In accordance with example embodiments, the sealant 120 may be any suitable gel-like substance that may serve to waterproof, prevent corrosion, or otherwise maintain the integrity of the wire connections. In some cases, for example, the sealant 120 may be a non-setting silicone. The appropriate amount of sealant 120 may be any predetermined amount that can be contained within the top portion 102 without overflowing when junction body 100 is open, while sufficient to fill the cavity of junction body 100 when closed (accounting for the volume of the internal components such as terminal block 130).

Figure 5:
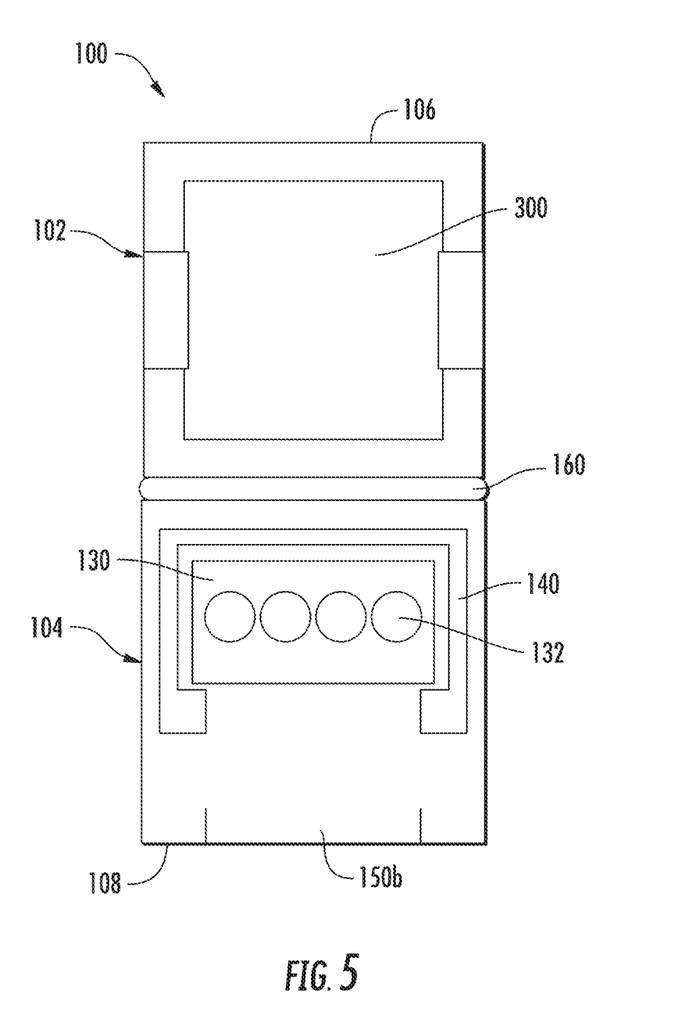
FIG. 5 is a diagrammatic plan view of a junction device in accordance with an example embodiment.
Figure 6:
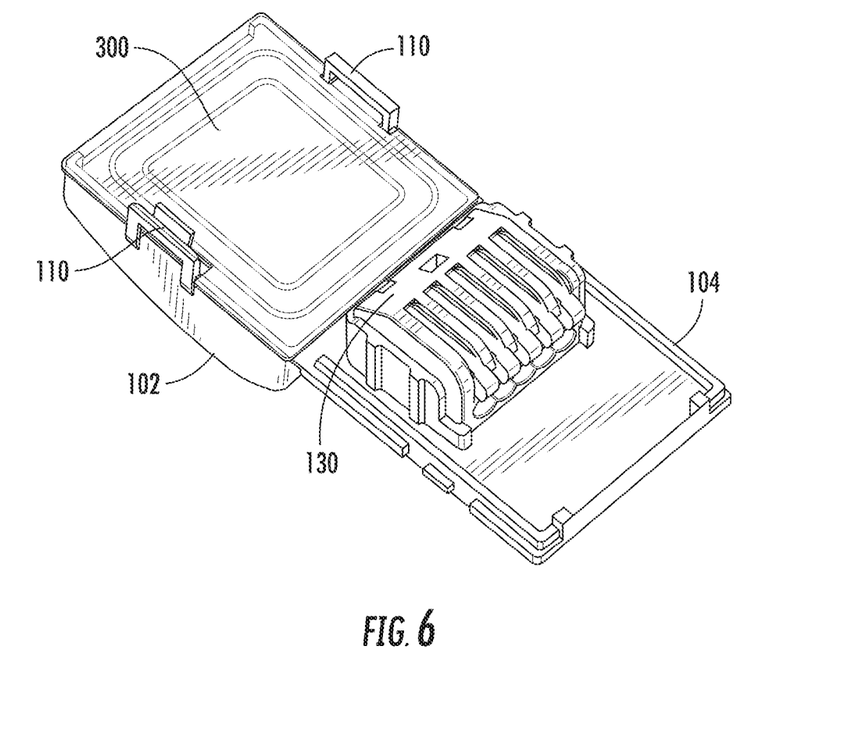
FIG. 6 is a perspective view of a junction device in accordance with an example embodiment in an open position with a removable sealant cap.

As shown in FIGS. 5 and 6, a cap 300 may be disposed over the top portion 102 in order to contain the sealant 120 within the top portion 102 prior to use (i.e., before the first electrical connections are made and the junction body 100 is closed). In an example embodiment, the cap 300 may be formed of a semi-rigid plastic material which is snapped into place on top portion 102 to effectively contain the sealant 120. For example, cap 300 may have attachment features (as shown in FIG. 6) by which it is advantageously connected using the hooks 110 on top portion 102 that are otherwise used to retain junction body 100 in the closed position. (One skilled in the art will appreciate, however, that cap 300 may be removably coupled with the top portion 102 in any suitable way.) At the time of use, cap 300 is removed from top portion 102 so that top portion 102 can be rotated via hinge 160 into engagement with bottom portion 104. By moving the top portion 102 from the first position to the second position, the sealant 120 may then enclose (seal off) the components disposed within the junction 40.

Figure 7:
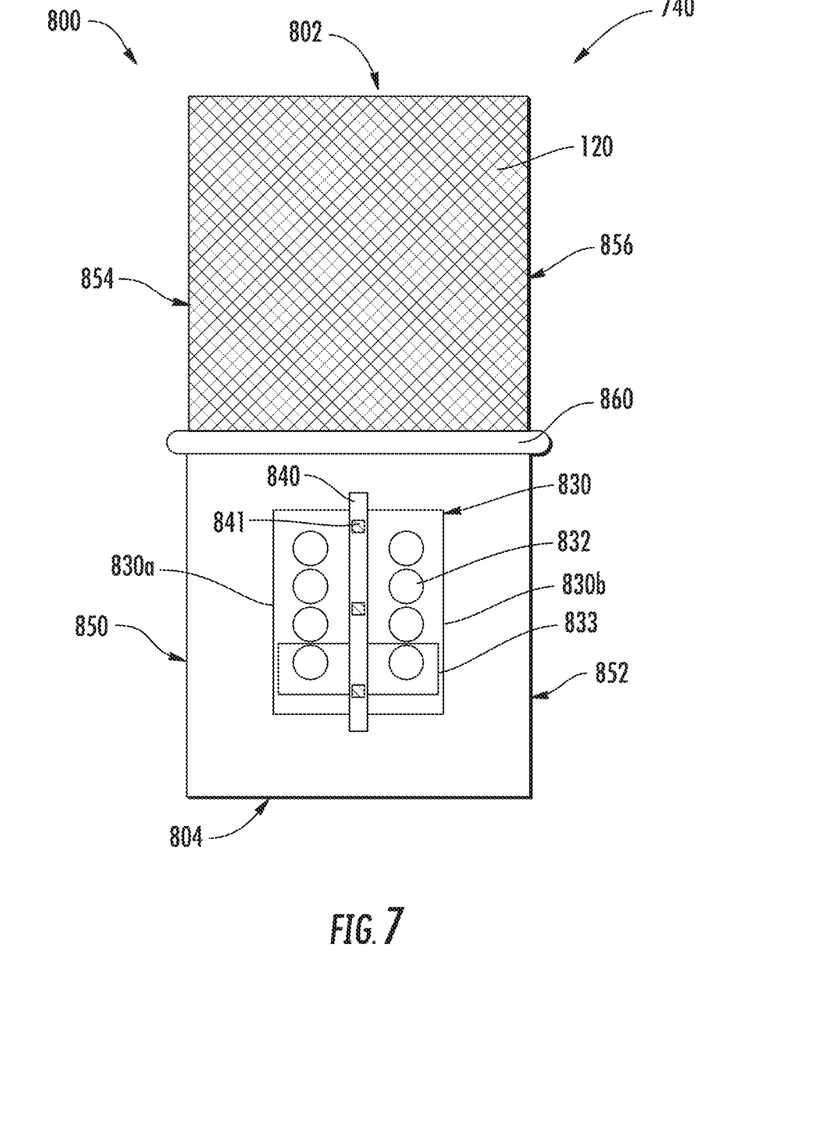
FIG. 7 is a diagrammatic plan view of a junction device in accordance with an example embodiment.

FIG. 7 illustrates an example of a junction 740 in accordance with a further embodiment of the present invention. One skilled in the art will appreciate that junction 740 is similar in many respects to junction 40. However, instead of containing a terminal block that connects wires of only one polarity, junction 740 includes a terminal block 830 having a first terminal portion 830a and a separate second terminal portion 830b which are electrically isolated from each other. Thus, the first terminal portion 830a may serve as the positive terminal portion and the second terminal portion 830b may serve as the negative terminal portion (or vice versa). As a result, the junction 740 may provide a single junction in which the user may connect both polarity wires of the lighting fixtures 30 and the power source 20.

The bottom portion 804 may include a partition wall 840 to support first and second terminal portions 830a and 830b. For example, the partition wall 840 may be fixed to the interior surface of the bottom portion 840 (e.g., formed integrally therewith) and extend upwardly therefrom. The partition wall 840 may be any suitable height that does not interfere with moving the top portion 802 from the first position to the second position into engagement with the bottom portion 804 (in this case via hinge 860). Moreover, the partition wall 840 may include at least one gap or other opening 841 for receiving a respective fastening device of the terminal block 830. The example embodiment illustrated in FIG. 7 includes three gaps 841 through which respective fasteners extend to interconnect first and second terminal portions 830a and 830b and retain them in position. In accordance with other example embodiments, however, the partition wall 840 may include more or less than three gaps 841. Further, each of the gaps 841 may have a predefined diameter such that the fastening device of the terminal block 400 may pass therethrough.

Each terminal portion 830a and 830b may include a plurality of ports 832 and a corresponding clamp as described above. The respective ports 832 of each terminal portion 830a and 830b are in electrical communication with one another. When opposite polarity wires of the power source 20 are connected in one of the ports 832 of the first and second terminal portions 830a and 830b, respectively, the power source 20 may provide power to each lighting fixture 30 also similarly connected to the terminal block 830. In other words, each port 832 of terminal portion 830a provides electrical connectivity to all other ports 832 of terminal portion 830a but not to those of terminal portion 830b. Similarly, each port 832 of terminal portion 830b provides electrical connectivity to all other ports 832 of terminal portion 830b but not to those of terminal portion 830a.

In order to connect the power source 20 and the lighting fixtures 30 to the terminal block 830 (i.e., the first and second terminal portions 830a and 830b), the wires of the power source 20 and lighting fixture 30 may be inserted into respective ports of the first and second terminal portions 830a and 830b. For example, the positive and negative polarity wires of the power source 20 may be respectively inserted by a user into the set of ports 832 indicated at 833. Specifically, the positive wire of the power source 20 may be inserted into one of the ports 832 indicated at 833 and the negative wire of the power source 20 may be inserted into the other of the ports 832 indicated at 833. It should be understood that the lighting fixtures 30 may be coupled to the first and second terminal portions 830a and 830b in a similar manner as the power source 20. Accordingly, the wires of a lighting fixture 30 may be inserted by a user into any available set of ports 832. Therefore, once the power source 20 and the lighting fixtures 30 are connected to the terminal block 830, power is provided to the lighting fixtures 30.

It should be understood that, when the terminal block 830 includes the first terminal portion 830a and the second terminal portion 830b, the junction body 800 may include a guide channel (as described above) on each side 850 and 852 to facilitate the wires being fed to ports 832 of the first terminal portion 830a and second terminal portion 830b, respectively.

Example embodiments therefore represent a junction device. The junction device may include a junction body, where the junction body includes a top portion and a bottom portion. The junction device may further include a terminal block disposed in the fixture body for facilitating the connection of a power source to at least one lighting fixture. The junction device may even further include a predetermined amount of sealant disposed in the fixture body.

In some embodiments, additional optional structures and/or features may be included or the structures/features described above may be modified or augmented. Each of the additional features, structures, modifications, or augmentations may be practiced in combination with the structures/features above and/or in combination with each other. Thus, some, all or none of the additional features, structures, modifications or augmentations may be utilized in some embodiments. Some example additional optional features, structures, modifications, or augmentations are described below, and may include, for example, that the terminal block may be disposed in the bottom portion of the junction body. Alternatively or additionally, the predetermined amount of sealant may be disposed in the top portion of the junction body. Alternatively or additionally, the junction may further include a removable cap, where the removable cap may be operably coupled to the top portion of the junction body to ensure the predetermined amount of sealant remains disposed in the top portion of the junction body prior to use. In some cases, the top portion may be rotatable from a first position to a second position, where in the first position, the top portion and the bottom portion may form an angle of about 90-180°, and where in the second position, the top portion and the bottom portion may lie substantially flush with each other. Alternatively or additionally, when the top portion rotates from the first position to the second position, some of the predetermined amount of sealant may move out of the top portion to the bottom portion to be disposed around the terminal block. In some example embodiments, the junction may further include a locking mechanism, where when the top portion is in the second position, the locking mechanism may be configured to operably couple the top portion and the bottom portion. In some cases, the bottom portion of the junction body may further include a support wall, where the terminal block may be disposed within the support wall to ensure the terminal block is secure within the bottom portion of the junction body. In some example embodiments, a second end of the top portion and a second end of the bottom portion may be operably coupled via a hinge. In some cases, the terminal block may include a plurality of ports and a plurality of clamping mechanisms corresponding to each of the plurality of ports, where each of the plurality of ports may be configured to receive respective wires of the power source or the at least one lighting fixture upon release of a corresponding clamping mechanism.

Many modifications and other embodiments of the inventions set forth herein will come to mind to one skilled in the art having the benefit of the teachings presented in the foregoing description and the associated drawings. Therefore, it is to be understood that the invention is not to be limited to the specific embodiments disclosed and that modifications and other embodiments are intended to be included within the scope of the appended claims. Moreover, although the foregoing description and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

The invention claimed is:

1. A landscape lighting junction device comprising:
   a junction body having a first portion and a second portion connectable together in a closed position to define an interior cavity, said first portion and said second portion being joined together along a respective proximal end thereof by a hinge;
   said first portion and said second portion each defining a respective first channel portion and second channel portion at a distal end thereof, the first channel portion and the second channel portion forming a wire guide for passage of a plurality of wires from said junction body when said first portion and said second portion of said junction body are in the closed position;

a seal structure located at said wire guide to surround the wires;

a terminal block disposed in the junction body in the closed position to facilitate the electrical connection of a power source to at least one lighting fixture, the terminal block having a plurality of ports oriented to face the wire guide and a plurality of clamping mechanisms respectively corresponding to each of the plurality of ports, wherein each of the plurality of ports are configured to receive a respective wire upon release of a corresponding clamping mechanism;

a plurality of pivotal levers operative to lock and unlock respective of the clamping mechanisms; and a predetermined amount of viscous sealant carried by the junction body which surrounds the terminal block when the first portion and the second portion of the junction body are in the closed position.

2. The landscape lighting junction device of claim 1, wherein the terminal block is coupled to the second portion of the junction body.

3. The landscape lighting junction device of claim 2, wherein the predetermined amount of sealant is disposed in the first portion of the junction body prior to use.

4. The landscape lighting junction device of claim 2, wherein the second portion of the junction body further comprises a support wall defining a receptacle for the terminal block, the terminal block being disposed within the receptacle.

5. The landscape lighting junction device of claim 1, wherein the seal structure comprises a first membrane wall at said first channel portion and a second membrane wall at said second channel portion.

6. A landscape lighting junction device comprising:

a junction body comprising a first portion and a second portion connectable together in a closed position defining an interior cavity, said first portion and said second portion being joined together along a respective proximal end thereof by a hinge;

said first portion and said second portion each defining a respective first channel portion and second channel portion at a distal end thereof, the first channel portion and the second channel portion forming a wire guide for passage of a plurality of wires from said junction body when said first portion and said second portion of said junction body are in the closed position;

a seal structure located at said wire guide to surround the wires;

a terminal block carried by one of the first portion and second portion of the junction body so as to be disposed in the junction body in the closed position, the terminal block facilitating the electrical connection of a power source to at least one lighting fixture;

the terminal block having a plurality of ports oriented to face the wire guide and a plurality of clamping mechanisms respectively corresponding to each of the plurality of ports, wherein each of the plurality of ports are configured to receive a respective wire upon release of a corresponding clamping mechanism;

a plurality of pivotal levers operative to lock and unlock respective of the clamping mechanisms; and a predetermined amount of sealant disposed in the junction body which surrounds the terminal block when the first portion and the second portion of the junction body are in the closed position.

7. The landscape lighting junction device of claim 6, wherein the seal structure comprises a first membrane wall at said first channel portion and a second membrane wall at said second channel portion.

\* \* \* \* \*